(12) United States Patent
Bailey et al.

(10) Patent No.: US 11,533,821 B2
(45) Date of Patent: Dec. 20, 2022

(54) PALLET INTERFACE FOR DATA CENTER AND RACK INFORMATION HANDLING SYSTEMS

(71) Applicant: DELL PRODUCTS, L.P., Round Rock, TX (US)

(72) Inventors: Mark M. Bailey, Round Rock, TX (US); Anthony P. Middleton, Cedar Park, TX (US); Jeffery T. Sayles, San Marcos, CA (US)

(73) Assignee: Dell Products, L.P., Round Rock, TX (US)

( * ) Notice: Subject to any disclaimer, the term of this patent is extended or adjusted under 35 U.S.C. 154(b) by 490 days.

(21) Appl. No.: 16/685,964

(22) Filed: Nov. 15, 2019

(65) Prior Publication Data
US 2021/0153375 A1    May 20, 2021

(51) Int. Cl.
*H05K 7/14* (2006.01)
*B65D 19/00* (2006.01)
*H05K 7/18* (2006.01)

(52) U.S. Cl.
CPC ....... *H05K 7/1497* (2013.01); *B65D 19/0004* (2013.01); *H05K 7/1495* (2013.01); *H05K 7/1498* (2013.01); *H05K 7/186* (2013.01); *B65D 2519/00815* (2013.01); *B65D 2585/6837* (2013.01)

(58) Field of Classification Search
CPC .................. B65D 69/00; B65D 85/00; B65D 2519/00815; B65D 2585/6837; B65D 19/0004

USPC ............................ 108/51.11–57.34; 206/223
See application file for complete search history.

(56) References Cited

U.S. PATENT DOCUMENTS

| | | | |
|---|---|---|---|
| 9,574,883 B2 * | 2/2017 | Watts | H04L 9/3278 |
| 9,701,330 B2 | 7/2017 | Mkandawire et al. | |
| 9,795,062 B1 * | 10/2017 | Ross | H05K 7/20745 |
| 9,843,470 B1 * | 12/2017 | Gartrell | H04L 65/40 |
| 10,093,450 B2 | 10/2018 | Embleton et al. | |
| 10,118,777 B1 | 11/2018 | Tower et al. | |
| 10,398,055 B1 * | 8/2019 | Tandon | G06Q 30/016 |
| 10,398,061 B1 * | 8/2019 | Ross | G06F 1/206 |
| 10,440,863 B1 * | 10/2019 | Shelnutt | H05K 7/20745 |
| 10,853,248 B1 * | 12/2020 | Moen | G06F 11/0751 |
| 11,191,181 B1 * | 11/2021 | Tandon | B25J 9/1679 |
| 2008/0056867 A1 | 3/2008 | Zuckerman | |
| 2010/0176076 A1 * | 7/2010 | Kern | G06Q 10/087 705/28 |

(Continued)

*Primary Examiner* — Jose V Chen
(74) *Attorney, Agent, or Firm* — Isidore PLLC

(57) ABSTRACT

A data center, a rack information handling system (RIHS) delivery kit, and a method provide for removing an RIHS from and delivering an RIHS to a data center. The data center includes an enclosure having a raised floor and a lateral opening. The lateral opening has a bottom edge that is aligned with the raised floor in order to transfer a rack information handling system (RIHS) through the lateral opening for a selected one of: (i) removing the RIHSs from the raised floor; and (ii) delivering the RIHS to the raised floor. The data center includes a pallet interface coupled to or integrated into an exterior edge of the raised floor and vertically presented to abut and engage a lateral edge of a roll-off rack shock pallet that supports the RIHS during transport.

20 Claims, 12 Drawing Sheets

(56) References Cited

U.S. PATENT DOCUMENTS

| | | | | |
|---|---|---|---|---|
| 2013/0321132 | A1* | 12/2013 | Chang | G06K 7/10366 |
| | | | | 340/10.41 |
| 2013/0345887 | A1* | 12/2013 | Govindan | H05K 7/1498 |
| | | | | 700/286 |
| 2015/0058542 | A1* | 2/2015 | Chao | G06F 11/3058 |
| | | | | 711/103 |
| 2015/0181750 | A1* | 6/2015 | Bailey | H05K 7/20736 |
| | | | | 361/679.48 |
| 2016/0039568 | A1* | 2/2016 | Huber | B65D 19/0077 |
| | | | | 108/55.3 |
| 2019/0332822 | A1* | 10/2019 | Shelnutt | G06F 21/6218 |
| 2021/0092875 | A1* | 3/2021 | Hellmann-Regen | |
| | | | | H05K 7/20745 |
| 2021/0112677 | A1* | 4/2021 | Bailey | H05K 7/1497 |
| 2021/0127523 | A1* | 4/2021 | Bailey | H05K 7/1491 |
| 2021/0360817 | A1* | 11/2021 | Bai | H05K 7/1492 |

* cited by examiner

PALLET INTERFACE FOR DATA CENTER AND RACK INFORMATION HANDLING SYSTEMS

BACKGROUND

1. Technical Field

The present disclosure generally relates to data centers that enclose rack information handling systems (RIHSs) and in particular to data centers having pallet interface infrastructure to remove and replace RIHSs.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or be configured for a specific user or specific use, such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems can be mounted in a rack ("rack information handling system (RIHS)") that enables the RIHS, as an assembly, to be transported to and removed from an enclosure. RIHSs are delivered to a building of a data center or a volumetric container of a modular data center (MDC) to add additional capability or to replace existing RIHSs. The RIHSs can have a significant vertical height and weight for increased density of information handling systems in the enclosure. Transporting RIHSs to an enclosure such as a building of a data center or volumetric container of an MDC can be difficult due to the vertical height and weight. Each RIHS can range in weight from as little as 700 lbs. to over 3800 lbs. These fully integrated RIHSs are required to survive the worldwide transportation environment, including transportation by truck, plane, boat, and/or other transportation medium. A rack shock pallet is the primary protection for the information technology (IT) hardware in the rack. Moving a palletized RIHS between the enclosure of the data center or volumetric container of the MDC and a transport vehicle can be difficult due to the different surface levels.

BRIEF SUMMARY

The present disclosure provides a data center configuration, a rack information handling system (RIHS) delivery kit, and a method for removing an RIHS from and delivering an RIHS to a data center.

According to one embodiment, a data center includes an enclosure having a raised floor and a lateral opening. The lateral opening has a bottom edge that is aligned with the raised floor in order to transfer a RIHS through the lateral opening for a selected one of: (i) removing the RIHSs from the raised floor; and (ii) delivering the RIHS to the raised floor. The data center includes a pallet interface coupled to or integrated into an exterior edge of the data center aligned with the raised floor and vertically presented to abut and engage a lateral edge of a roll-off rack shock pallet that supports the RIHS during transport.

According to another embodiment, an RIHS delivery kit includes a docking alignment plate attachable to a raised floor of an enclosure of a data center. The enclosure has a raised floor and a lateral opening having a bottom edge that is aligned with the raised floor. An RIHS is transferred through the lateral opening for a selected one of: (i) removing the RIHSs from the raised floor; and (ii) delivering the RIHS to the raised floor. The docking alignment plate is horizontally alignable with the lateral opening of the enclosure. The docking alignment plate is coupled to or integrated into an exterior edge of the raised floor. A loading platform of the RIHS delivery kit has a first edge engagement to the docking plate to align an upper surface of the loading platform with the raised floor of the enclosure, the loading platform having a second edge that comprises a pallet interface that is vertically presented to abut and engage a lateral edge of a roll-off rack shock pallet that supports the RIHS during transport. According to an additional embodiment, a method is provided for removing an RIHS from and delivering an RIHS to a data center. The method includes horizontally aligning a docking alignment plate with a lateral opening to an enclosure of the data center having a raised floor. The lateral opening has a bottom edge that is aligned with the raised floor in order to transfer an RIHS through the lateral opening for a selected one of: (i) removing the RIHS from the raised floor; and (ii) delivering the RIHS to the raised floor. The method includes attaching the docking alignment plate to an exterior edge of the raised floor beneath the lateral opening. The method includes engaging a first edge of a loading platform to the docking alignment plate that aligns an upper surface of the loading platform to the raised floor. The method includes engaging a lateral edge of a roll-off rack shock pallet to an exterior facing second edge of the loading platform. The method includes translating an RIHS between the roll-off rack shock pallet and the loading platform.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements.

Embodiments incorporating teachings of the present disclosure are shown and described with respect to the figures presented herein, in which.

DETAILED DESCRIPTION

Figure 1:
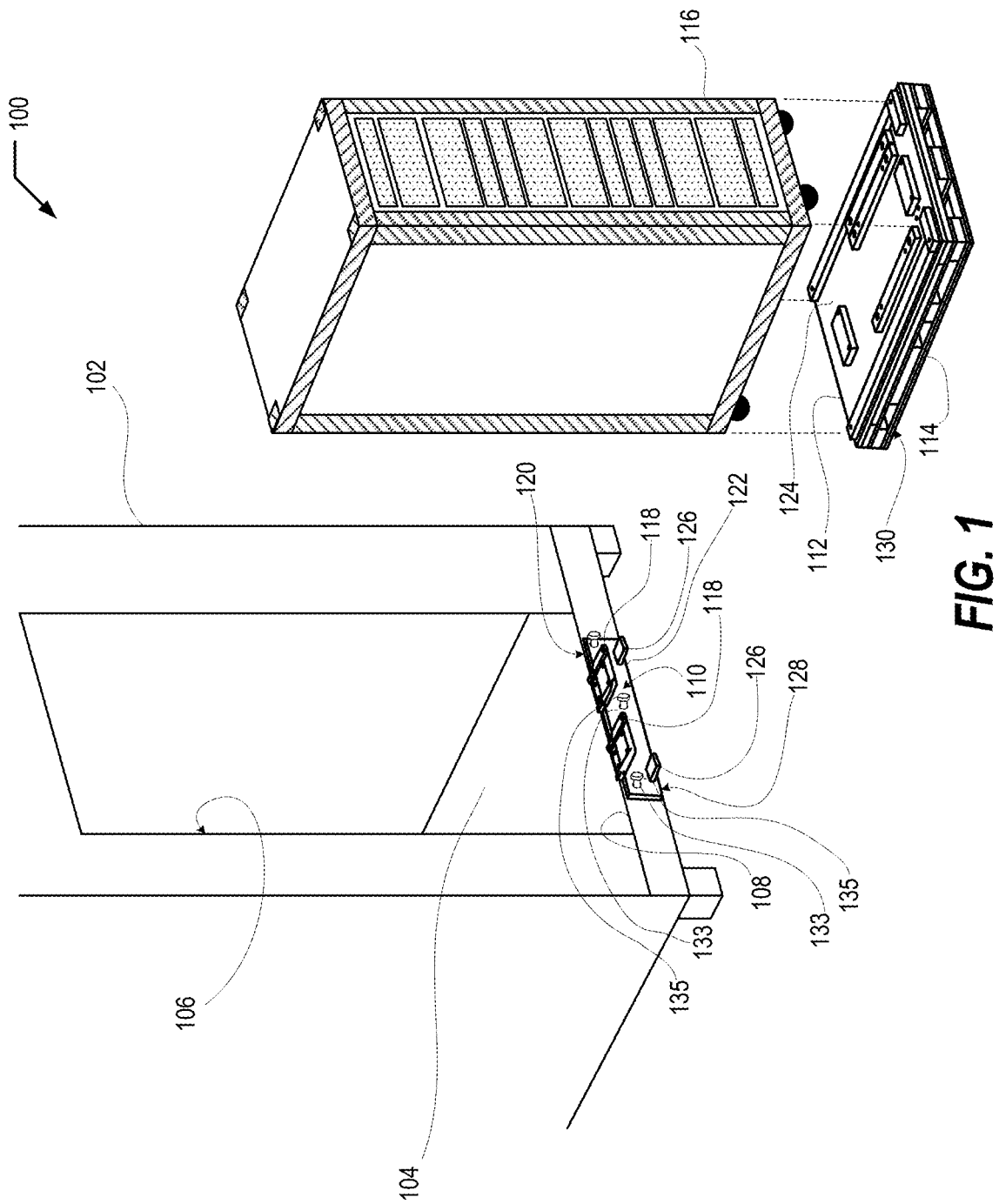
FIG. 1 is a three-dimensional representation of an example data center having a pallet interface and a palletized rack information handling system (RIHS), according to one or more embodiments.

The illustrative embodiments provide a data center, a rack information handling system (RIHS) delivery kit, and a method for removing an RIHS from and delivering an RIHS to a data center. The RIHS delivery kit mitigates differences in surface level between a transport vehicle and the data center. Loading and unloading of roll-off rack shock pallets onto a surface that is horizontally aligned ensures stable positioning of the RIHS during transfer.

According to one embodiment, a data center includes an enclosure having a raised floor and a lateral opening. The lateral opening has a bottom edge that is aligned with the raised floor in order to transfer a RIHS through the lateral opening for a selected one of: (i) removing the RIHSs from the raised floor; and (ii) delivering the RIHS to the raised floor. The data center includes a pallet interface coupled to or integrated into an exterior edge of the data center aligned with the raised floor and vertically presented to abut and engage a lateral edge of a roll-off rack shock pallet that supports the RIHS during transport. With a lateral opening through which RIHSs can be moved, the pallet interface facilitates correctly aligning a rack shock pallet level with the edge of the raised floor of the data center so that the RIHS can be readily moved onto or off of the pallet, especially if the rack shock pallet is configured for roll-off of the RIHS. In one or more embodiments, a forklift, which moves the rack shock pallet to the data center, causes the rack shock pallet to engage the pallet interface aligning the pallet without having to place the pallet itself on a dock or the raised floor. The forklift supports the engaged rack shock pallet during either unloading of the RIHS from the pallet or loading the RIHS onto the pallet.

According to another embodiment, an RIHS delivery kit is temporarily used at the data center to deliver or remove RIHSs through a particular lateral opening. In addition to features of the pallet interface, an RIHS delivery kit includes a docking alignment plate and a loading dock/platform that has the pallet interface. The loading platform interposes between the raised floor of the data center and the pallet interface of the loading dock. The loading platform provides workspace for intermediate placement of the RIHS when transitioning from pallet to pallet jack. The pallet interface facilitates engagement of the rack shock pallet, and the docking alignment plate facilitates engagement of the loading platform to the data center. The docking alignment plate is attachable to a raised floor of an enclosure of a data center. The enclosure has a raised floor and a lateral opening having a bottom edge that is aligned with the raised floor in order to transfer an RIHS through the lateral opening for a selected one of: (i) removing the RIHS from the raised floor; and (ii) delivering the RIHS to the raised floor. The docking alignment plate is horizontally alignable with the lateral opening of the enclosure. The RIHS delivery kit includes a loading platform having a first edge engagement to the docking alignment plate to align an upper surface of the loading platform with the raised floor of the enclosure. The loading platform has a second edge that comprises a pallet interface that is vertically presented to abut and engage a lateral edge of a roll-off rack shock pallet that supports the RIHS during transport.

According to an additional embodiment, a method is provided for removing an RIHS from and delivering an RIHS to a data center. The method includes horizontally aligning a docking alignment plate with a lateral opening to an enclosure of the data center having a raised floor. The lateral opening has a bottom edge that is aligned with the raised floor in order to transfer an RIHS through the lateral opening for a selected one of: (i) removing the RIHS from the raised floor; and (ii) delivering the RIHS to the raised floor. The method includes attaching the docking alignment plate to an exterior edge of the raised floor beneath the lateral opening. The method includes engaging a first edge of a loading platform to the docking alignment plate that aligns an upper surface of the loading platform to the raised floor. The method includes engaging a lateral edge of a roll-off rack shock pallet to an exterior facing second edge of the loading platform. The method includes translating an RIHS between the roll-off rack shock pallet and the loading platform.

For purposes of the present disclosure, the floor of the data center is raised at least to a height of a rack shock pallet and is not level with the surrounding surface. In on one or more embodiments, the floor of the data center can be raised to any height that can be accommodated by a forklift vehicle.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized, and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

Figure 2:
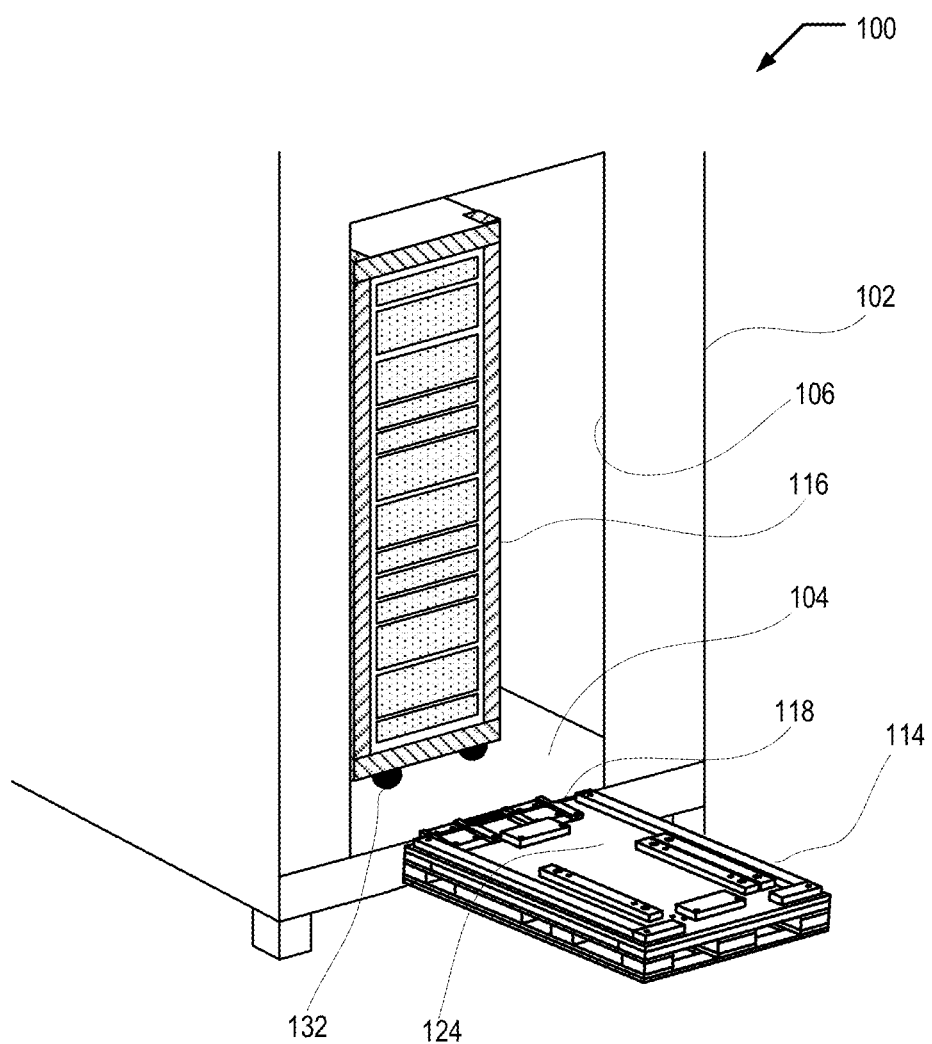
FIG. 2 is a three-dimensional representation of the example data center having the pallet interface engaged to a rack shock pallet to receive RIHS, according to one or more embodiments.

FIG. 1 depicts a three-dimensional representation of example data center 100, within which one or more of the described features of the various embodiments of the disclosure can be implemented. Data center 100 includes enclosure 102 having raised floor 104 and lateral opening 106 having bottom edge 108 that is horizontally aligned with the raised floor 104. In one or more embodiments, enclosure 102 is a building that is assembled at a fixed location. In one or more other embodiments, enclosure 102 is a volumetric container of a modular data center (MDC). Pallet interface 110 is coupled to raised floor 104 and vertically presented below lateral opening 106. As depicted in FIG. 2, pallet interface 110 is intended to abut and engage lateral edge 112 of rack shock pallet 114. Engagement by pallet interface 110 prevents movement of the abutting edge of rack shock pallet 114 in any direction except for being horizontally moved away from pallet interface 110. With rack shock pallet 114 moved into engagement with pallet interface 110 by a forklift, rack shock pallet 114 is held securely in alignment with raised floor 104 of data center 100. In one or more embodiments, alignment of rack shock pallet 114 with raised floor 104 means linear alignment and close proximity of abutting edges of rack shock pallet 114 with raised floor 104. In one or more particular embodiments, alignment of rack shock pallet 114 with raised floor 104 additionally means that a geometric plane of raised floor 104 is in alignment with a geometric plane of top surface of rack shock pallet 114. In one or more specific embodiments, the geometric planes of rack shock pallet 114 with raised floor 104 are both horizontal and at the same vertical height for alignment.

With continuing reference to FIG. 1, pallet shock pallet 114 supports rack information handling system (RIHS) 116 during transport. Pallet interface 110 enables transfer of RIHS 116 through lateral opening 106 for a selected one of: (i) removing RIHS 116 from raised floor 104 and (ii) delivering RIHS 116 to raised floor 104. For purposes of this disclosure, an information handling system, such as RIHS 116, may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a handheld device, personal computer, a server, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring specifically to FIG. 1, pallet interface 110 includes top guide(s) 118 extending from top edge 120 of mounting plate 122 of pallet interface 110. Top guide(s) 118 are positioned to contact top surface 124 of rack shock pallet 114. Bottom guide(s) 126 extend from bottom edge 128 of mounting plate 122 to provide surface-to-surface contact with downward surface 130 of rack shock pallet 114. In one or more embodiments, pallet interface 110 has fastener holes 133 through which fasteners 135 are engaged to data center 100. In one or more embodiments, pallet interface 110 (FIG. 1) comprises metal that is welded to a metal frame of data center 100.

FIG. 2 depicts a three-dimensional representation of example data center 100 having pallet interface 110 engaged to rack shock pallet 114. Top guide(s) 118 and bottom guide(s) 126 (FIG. 1) receive and align rack shock pallet 114. With top surface 124 of rack shock pallet 114 aligned with raised floor 104 of data center 100, RIHS 116 is rolled through lateral opening 106 into enclosure 102 of data center 100 using castors 132. In one or more embodiments, RIHS 116 is slid or lifted off of rack shock pallet 114 by a pallet jack that is used on raised floor 104.

Figure 3:
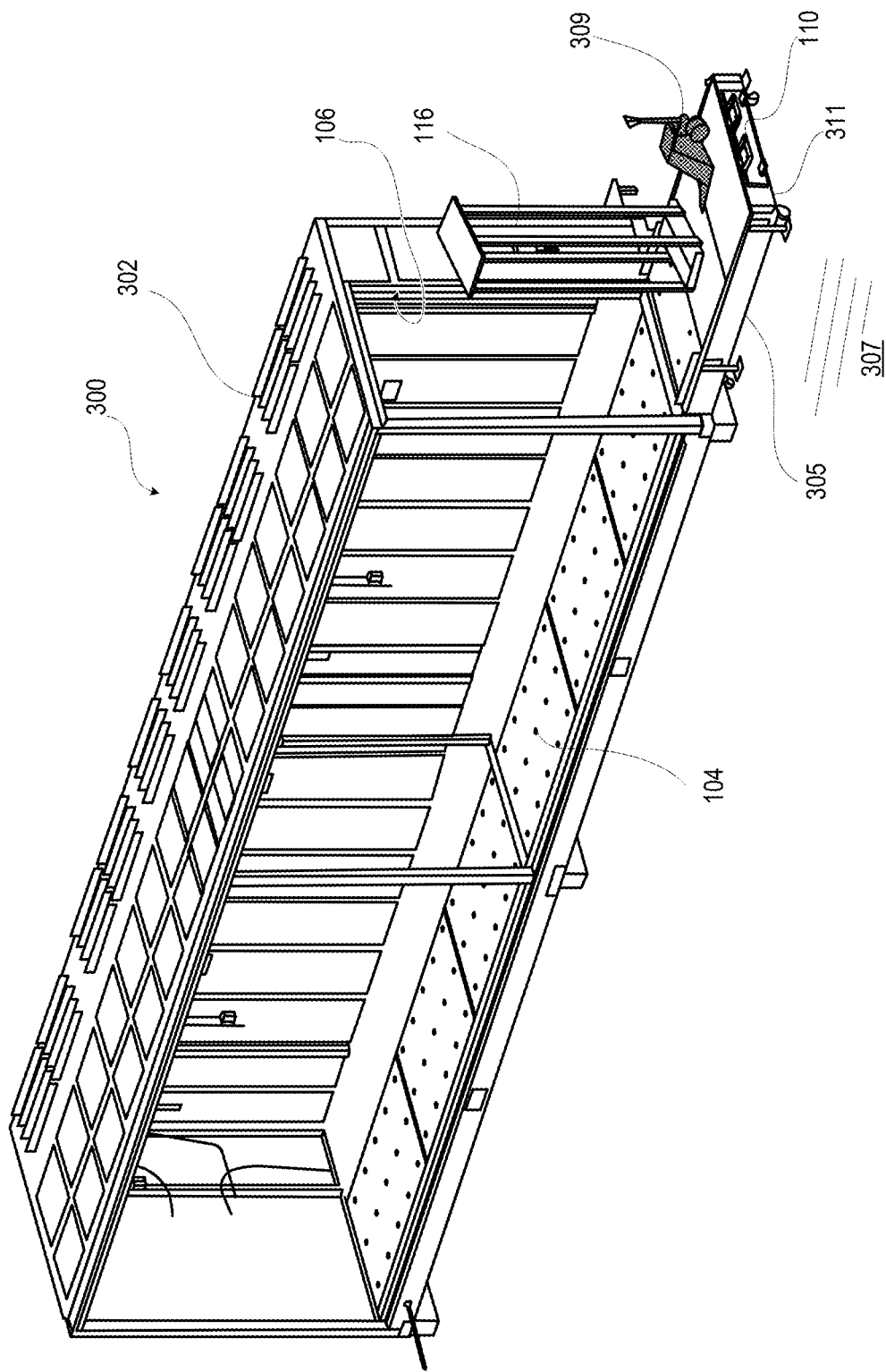
FIG. 3 is a three-dimensional representation of a modular data center (MDC) having the pallet interface attached to a loading platform, according to one or more embodiments.

FIG. 3 depicts a three-dimensional representation of example modular data center (MDC) 300 having, as an enclosure, elongated volumetric container 302, such as an information technology (IT) pre-assembled component (IT-PAC) container that is transportable as a modular data center (MDC). Raised floor 104 is shaped to receive a first in, first out (FIFO) longitudinal row of RIHSs 116 through lateral opening 106. Pallet interface 110 is attached to loading platform 305, which is temporarily mounted to raised floor 104. Loading platform 305 provides a loading surface 307 that is aligned with raised floor 104. In one or more embodiments, alignment of with raised floor 104 means linear alignment and close proximity of abutting edges of loading surface 307 with raised floor 104 of MDC 300. Placement of pallet interface 110 provides the linear alignment. Loading surface 307 of loading platform 305 can provide a work area, such as for engaging a pallet jack 309. Instead of being mounted directly to raised floor 104, pallet interface 110 is attached to distal, outward edge 311 of loading platform 305.

Figure 4:
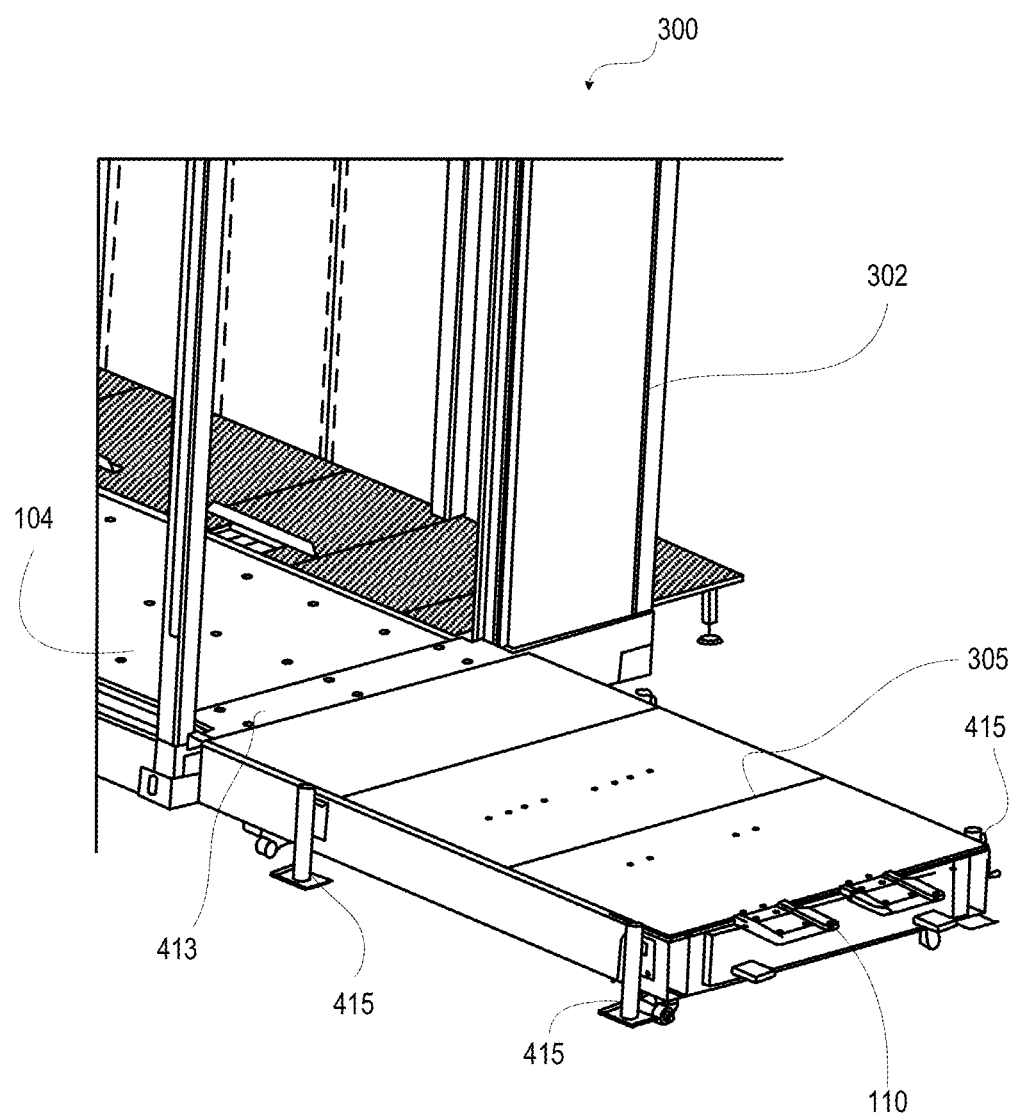
FIG. 4 is an enlarged three-dimensional representation of the loading platform engaged to the MDC of FIG. 3, according to one or more embodiments.

FIG. 4 is an enlarged, three-dimensional representation of loading platform 305 engaged to raised floor 104 of volumetric container 302. Transition plate 413 is inserted in lateral opening 106 between raised floor 104 and loading platform 305 to provide a smooth rolling surface. Height adjustable supports 415 are extendable downward from loading platform 305 to rest on ground surface 417 in order to level loading surface 307 of loading platform 305 relative to raised floor 104. In one or more particular embodiments, alignment of loading surface 307 and rack shock pallet 114 with raised floor 104 additionally means that a geometric plane of raised floor 104 is in alignment with a geometric plane of loading surface 307. In one or more specific embodiments, the geometric planes of loading surface 307 with raised floor 104 are both horizontal and at the same vertical height for alignment.

Figure 5:
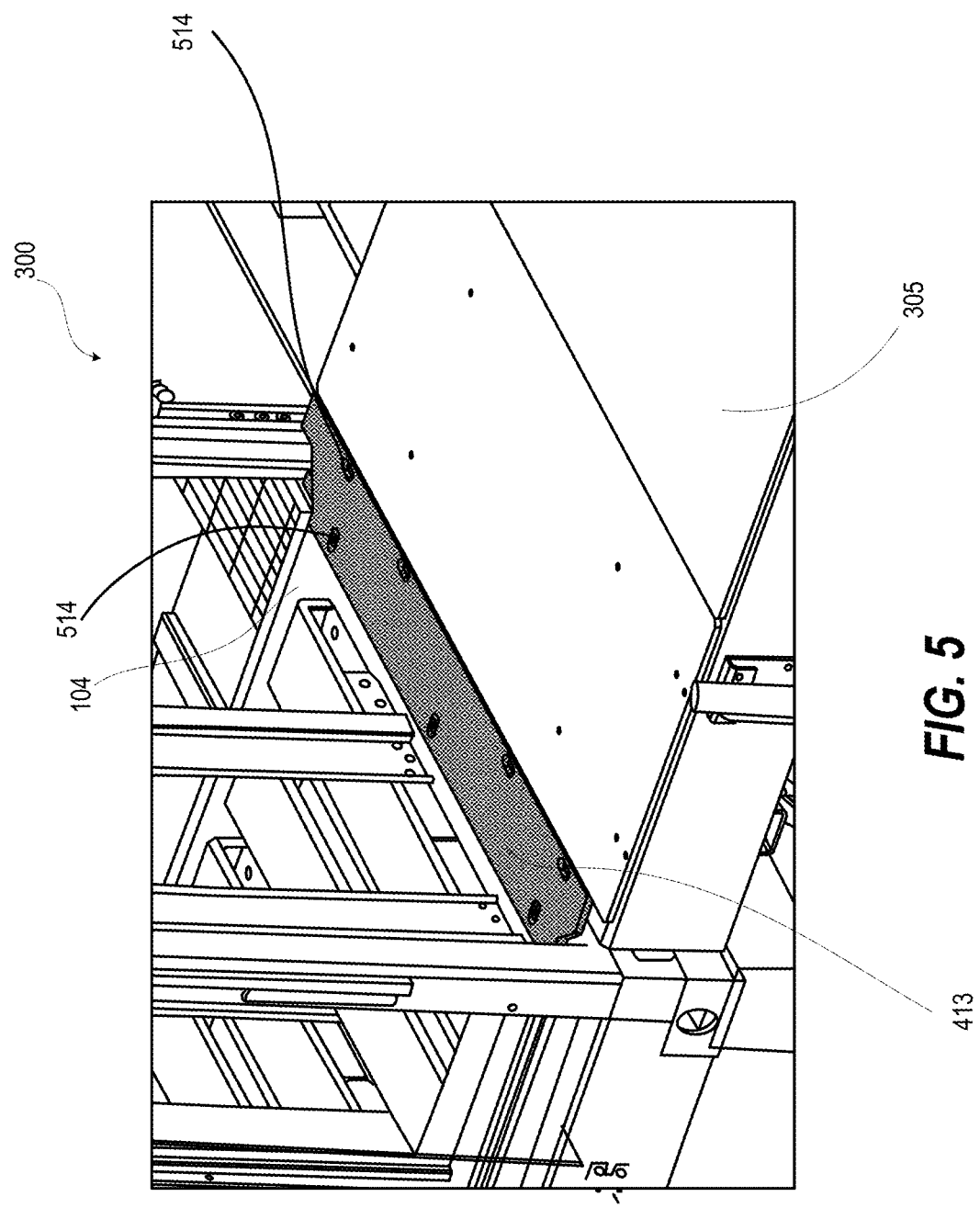
FIG. 5 is an enlarged three-dimensional representation of a transition plate positioned between a proximal edge of the loading platform and the MDC of FIG. 3, according to one or more embodiments.

FIG. 5 is an enlarged three-dimensional representation of transition plate 413 positioned between a proximal edge of loading platform 305 and MDC 300. Transition plate 413 covers a gap between raised floor 104 and loading platform 305 that would interfere with a pallet jack. Fastener holes 514 aligns fasteners to both MDC 300 and loading platform 305, securing loading platform 305.

Figure 6:
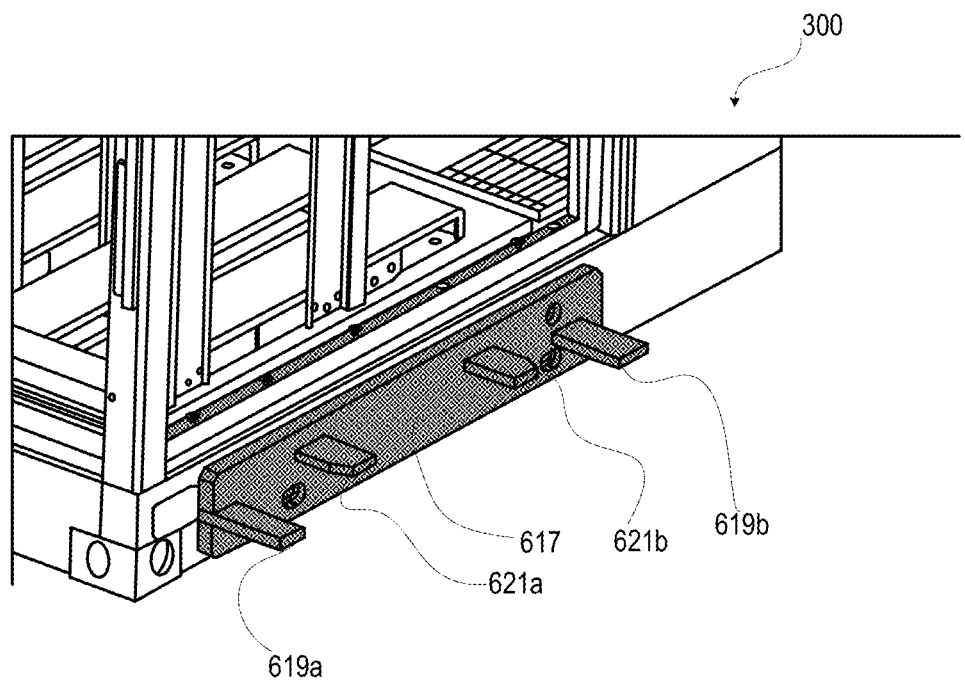
FIG. 6 is an enlarged three-dimensional representation of a docking alignment plate attached to a raised floor of the MDC of FIG. 3, according to one or more embodiments.
Figure 7:
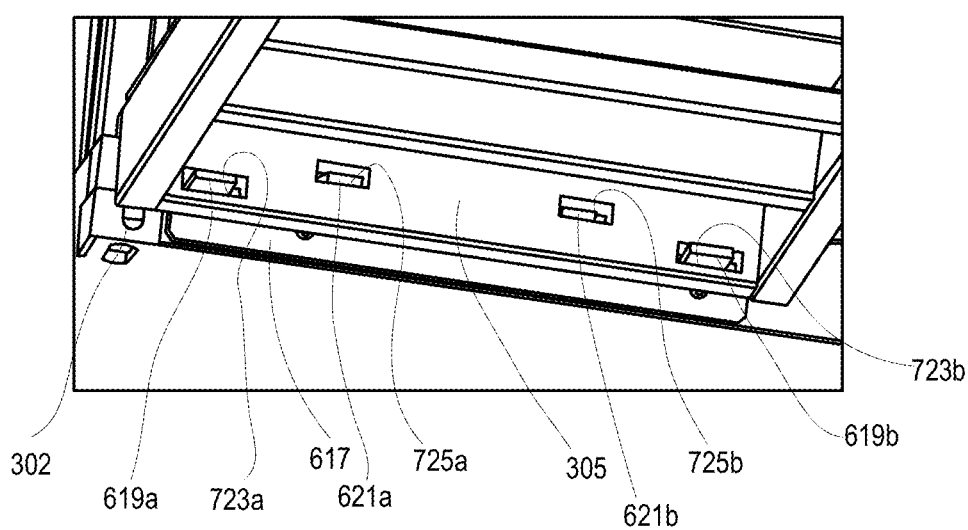
FIG. 7 is an enlarged three-dimensional representation of the rack shock pallet engaged to the pallet interface on a distal edge of the loading platform of FIG. 3, according to one or more embodiments.

FIG. 6 is an enlarged three-dimensional representation of docking alignment plate 617 attached to an exterior edge of volumetric container 302. Extending horizontally from docking alignment plate 617 are lower outboard male engagement members 619a, b and upper inboard male engagement members 621a, b. Now with reference to FIG. 7, there is illustrated an enlarged three-dimensional representation of an underside of loading platform 305. Loading platform 305 incudes lower outboard female engagement members 723a, b and upper inboard female engagement member 725a, b that respectively engage in a complementary way to lower outboard male engagement members 619a, b and upper inboard male engagement member 621a, b of docking alignment plate 617.

Figure 8:
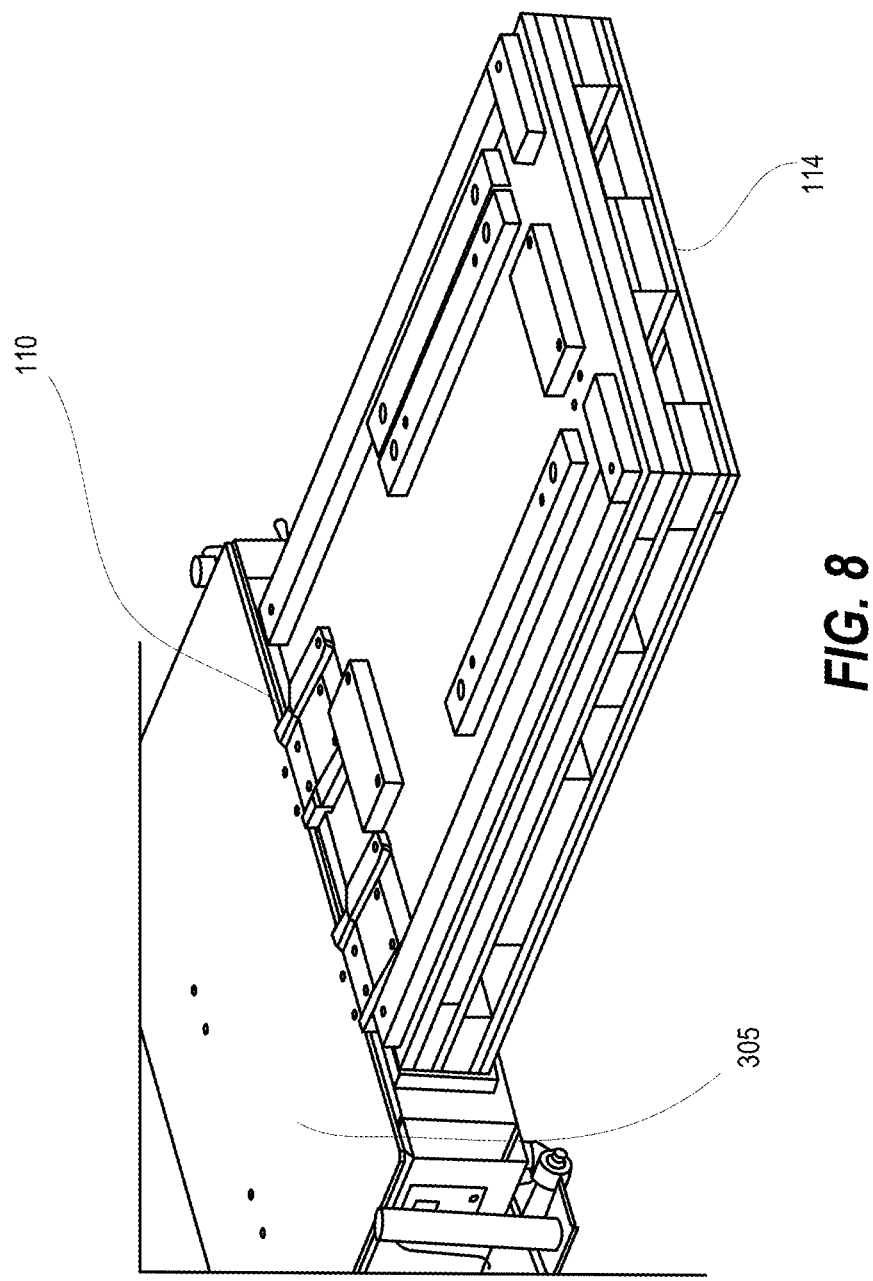
FIG. 8 is an enlarged three-dimensional representation of an underside of the rack shock pallet engaged to the pallet interface, according to one or more embodiments.

Now with reference to FIG. 8, there is illustrated an enlarged three-dimensional representation of rack shock pallet 114 engaged to pallet interface 110 on distal edge of loading platform 305 that provides alignment with loading surface 307 of loading platform 305. In one or more embodiments, alignment of rack shock pallet 114, with loading platform 305 means linear alignment and close proximity of abutting edges of rack shock pallet 114 with loading platform 305. This linear alignment is provided by placement of pallet interface 110 on loading platform 305. In one or more particular embodiments, alignment of rack shock pallet 114 with loading platform 305 additionally means that a geometric plane of loading platform 305 is in alignment with a geometric plane of top surface 124 of rack shock pallet 114. In one or more specific embodiments, the geometric planes of rack shock pallet 114 with loading platform 305 are both horizontal and at the same vertical height for alignment.

Figure 9:
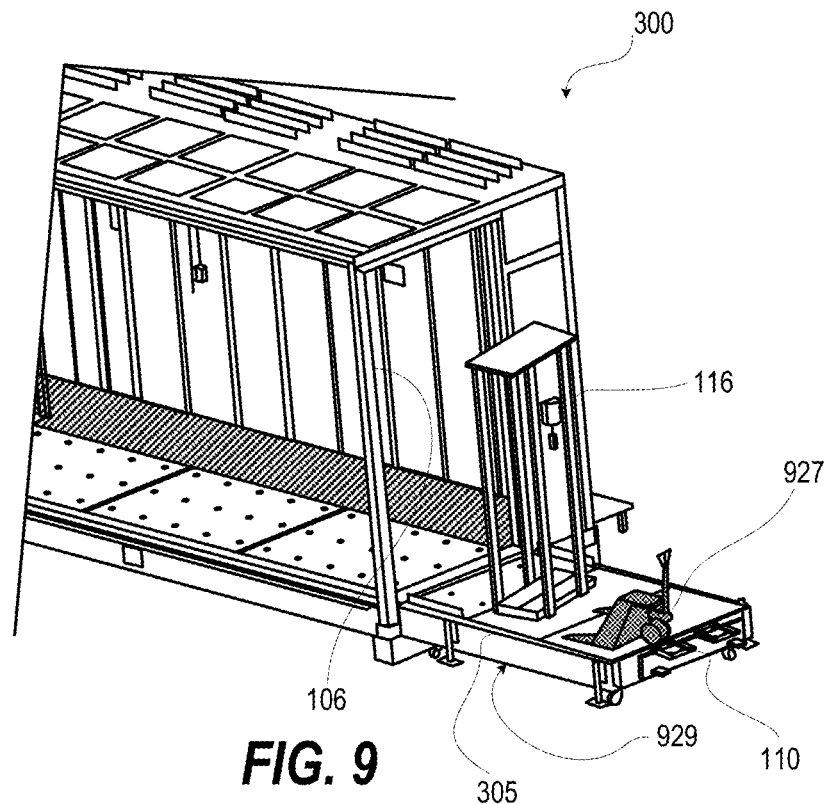
FIG. 9 is a three-dimensional representation of the MDC of FIG. 3 with a pallet jack of an RIHS delivery kit on the loading platform, according to one or more embodiments.
Figure 10:
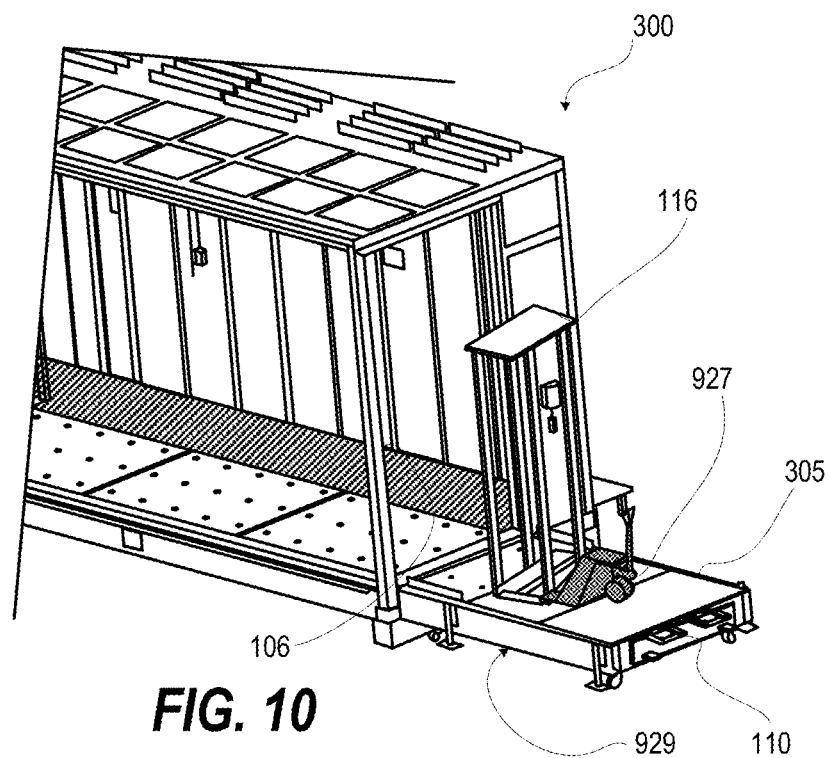
FIG. 10 is a three-dimensional representation of the MDC of FIG. 3 with the pallet jack engaged to the RIHS, according to one or more embodiments.

FIG. 9 is a three-dimensional representation of MDC 300 with pallet jack 927 that is sized to pass through lateral opening 106. In one or more embodiments, RIHS delivery kit 929 includes pallet jack 927 that is selected or customized for moving on loading platform 305 and through lateral opening 106. RIHS delivery kit 929 also includes loading platform 305, pallet interface 110, and docking alignment plate 617 (FIG. 6). In one or more embodiments, MDC 300 is prepared for transfer of RIHSs by attaching components of RIHS delivery kit 929, which can be reused at other locations, reducing the cost of the MDC 300. In addition, removal of loading platform 305 reduces the footprint of MDC 300. Now with reference to FIG. 10, there is illustrated a three-dimensional representation of the MDC 300 with the pallet jack 927 engaged to RIHS 116. Pallet jack 927 is no wider than lateral opening 106. In one or more embodiments, pallet jack 927 is no wider than lateral opening RIHS 116 and is able to maneuver on the width provided by loading platform 305.

Figure 11:
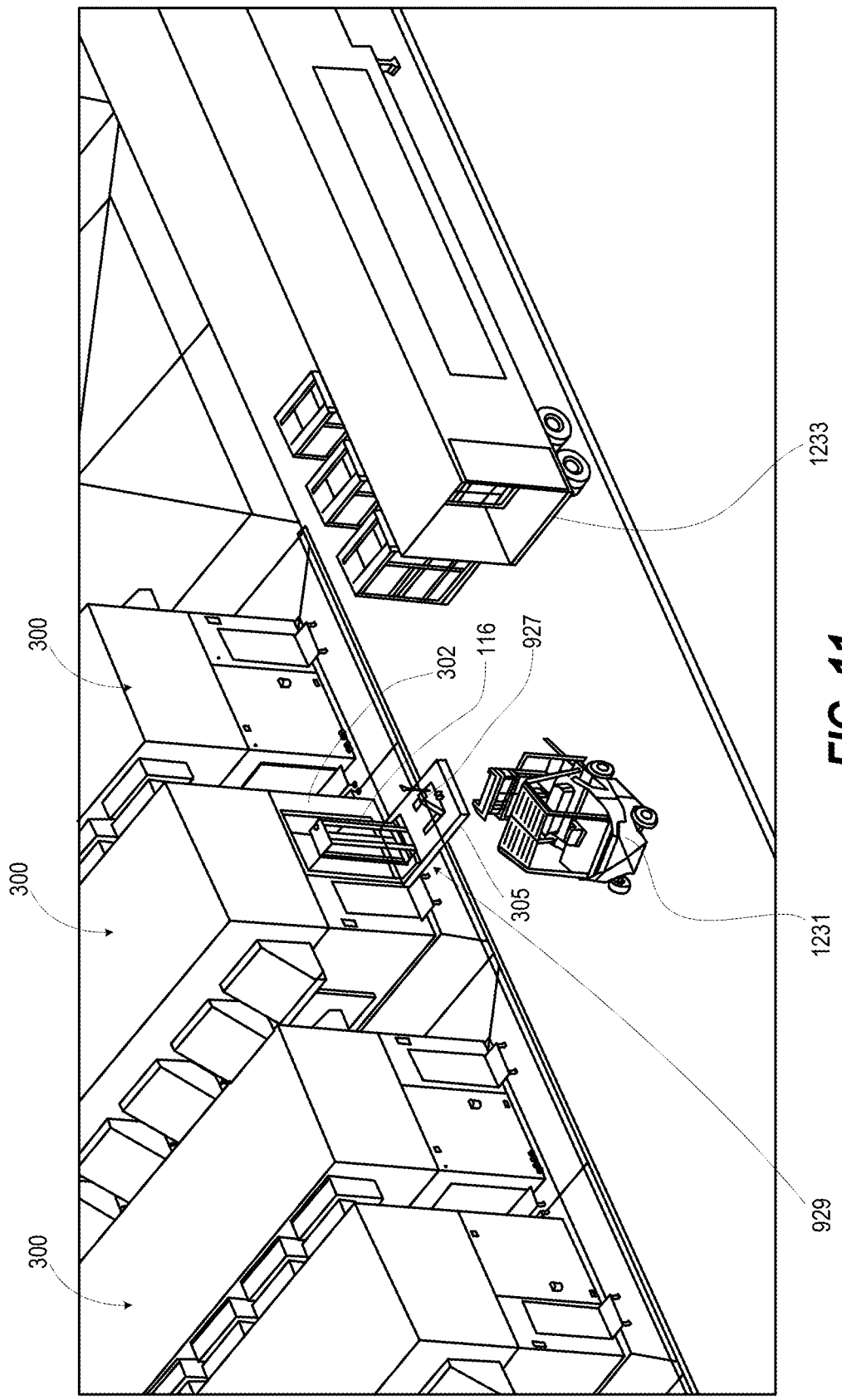
FIG. 11 is a perspective view of a first RIHS moved to a loading platform attached to a MDC, according to one or more embodiments.
Figure 12:
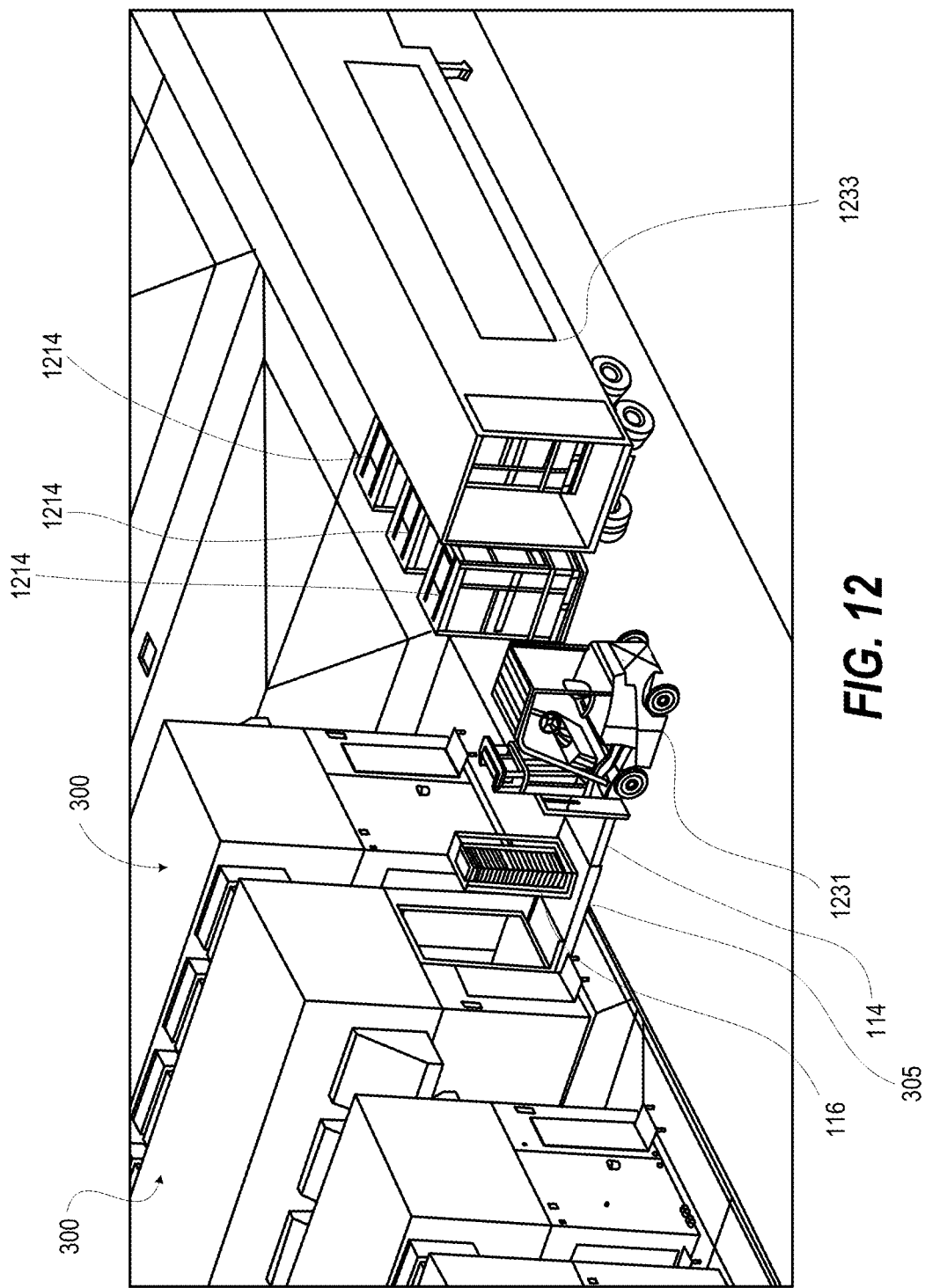
FIG. 12 is a perspective view of rack shock pallet engaged to the loading platform, according to one or more embodiments.

In use, FIG. 11 is a perspective view of RIHS 116 moved from enclosure 302 onto loading platform 305. Pallet jack 927 is placed aside on loading platform 305. Forklift 1231 is provided for used with RIHS delivery kit 929 to facilitate transfer of RIHSs 116 from MDC 300. Now with reference to FIG. 12, there is illustrated a perspective view of rack shock pallet 114 engaged to loading platform 305. Forklift 1231 supports and positions rack shock pallet 114 in preparation for receiving the weight of RIHS 116. Forklift 1231 then moves RIHS 116 to truck 1233 for taking away. New RIHSs 1214 that were delivered by truck 1233 are moved into MDC 300 using a reverse procedure.

Figure 13A:
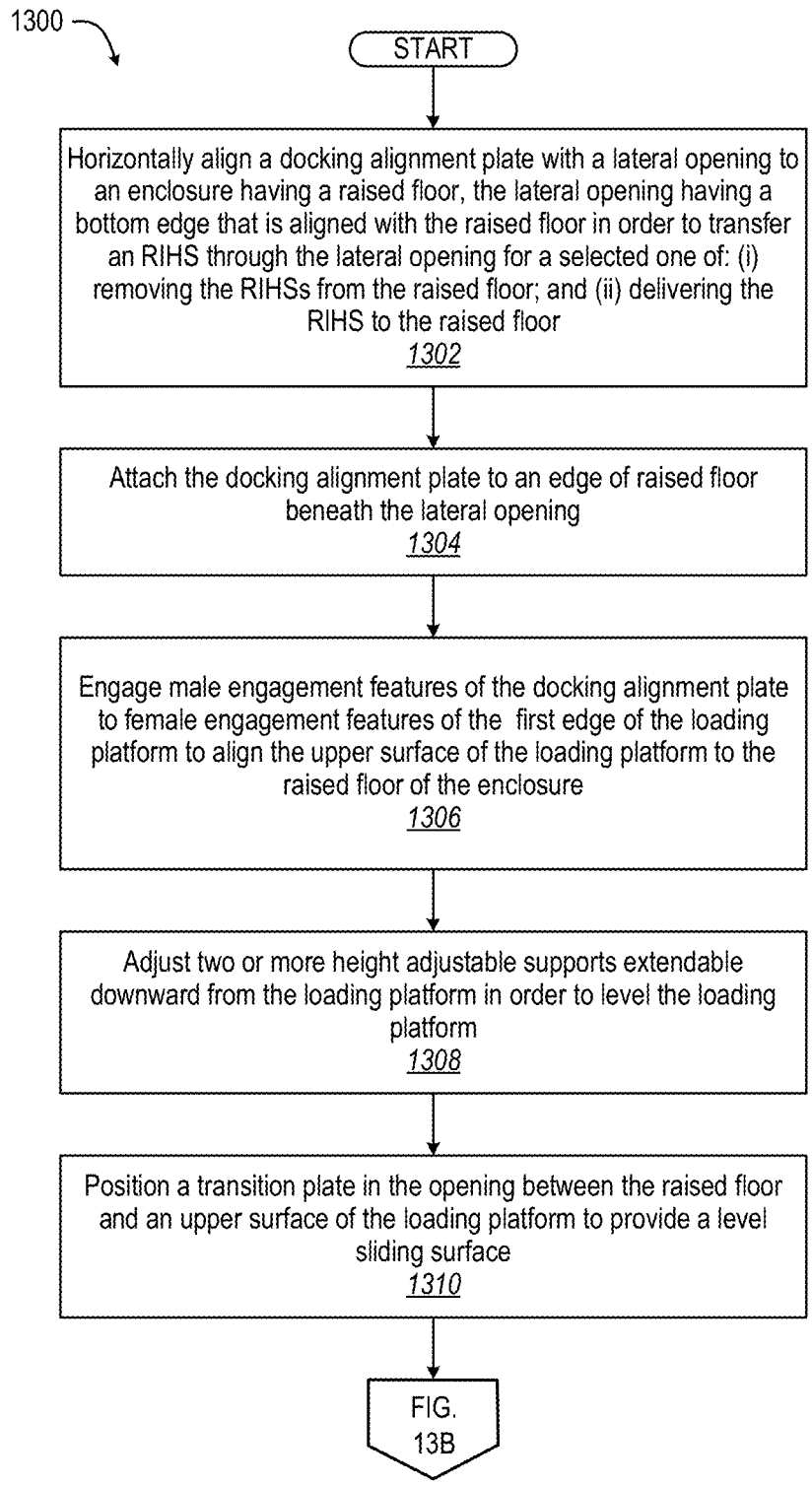
FIGS. 13A and 13B (FIG. 13) is a flow chart of a method for removing an RIHS from and delivering an RIHS to a data center, according to one or more embodiments.
Figure 13B:
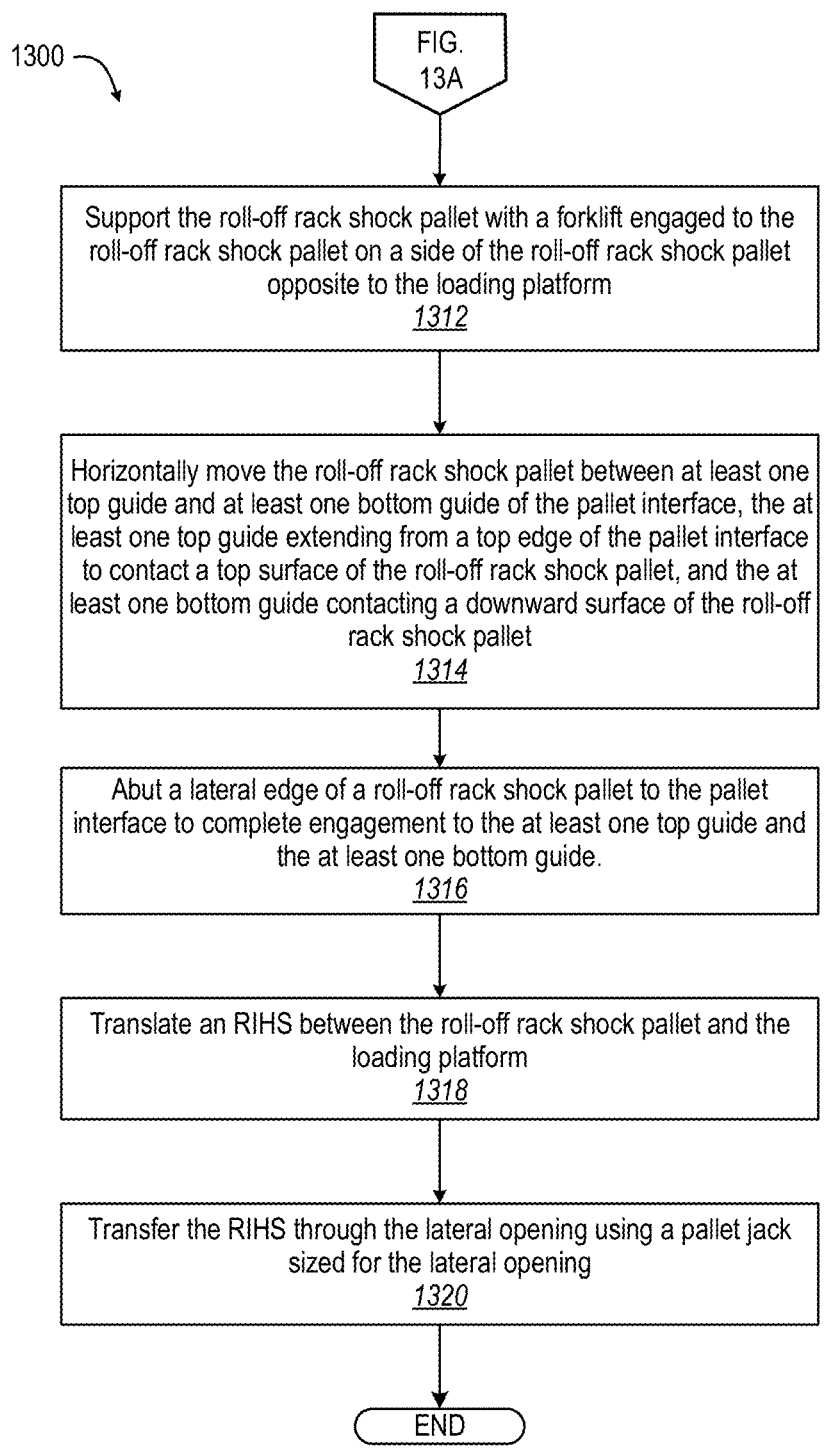

FIGS. 13A-13B (FIG. 13) present a flow chart of method 1300 for removing RIHS 116 from and delivering an RIHS 116 to data center 100 (FIG. 1). The description of method 1300 is provided with general reference to the specific components illustrated within the preceding FIGS. 1-12. In one or more embodiments, method 1300 can be implemented using automated assembly equipment or machines that are at least partially controlled by a controller or IHS. With reference to FIG. 13A, method 1300 includes horizontally aligning a docking alignment plate with a lateral opening of a data center enclosure having a raised floor. The lateral opening has a bottom edge that is aligned with the raised floor in order to transfer an RIHS through the lateral opening for a selected one of: (i) removing the RIHSs from the raised floor; and (ii) delivering the RIHS to the raised floor (block 1302). Method 1300 includes attaching the docking alignment plate to an exterior edge of the enclosure, beneath the lateral opening (block 1304). Method 1300 includes engaging male engagement features of the docking alignment plate to female engagement features of the first edge of the loading platform, or vice versa (block 1306). That is, in an alternate embodiment, method 1300 includes engaging female engagement features of docking alignment plate to make engagement features or the edge of the loading platform. The engagement aligns the upper surface of the loading platform to the raised floor of the enclosure. Method 1300 includes adjusting two or more height adjustable supports extendable downward from the loading platform in order to horizontally level the loading platform (block 1308). Method 1300 includes positioning a transition plate in the opening between the raised floor and an upper surface of the loading platform to provide a level sliding surface (block 1310).

With reference to FIG. 13B, method 1300 includes supporting the roll-off rack shock pallet with a forklift engaged to the roll-off rack shock pallet on a side of the roll-off rack shock pallet opposite to the loading platform (block 1312). Method 1300 includes horizontally moving the roll-off rack shock pallet between at least one top guide and at least one bottom guide of the pallet interface (block 1314). The at least one top guide extends from a top edge of the pallet interface to contact a top surface of the roll-off rack shock pallet. The at least one bottom guide contacts a downward surface of the roll-off rack shock pallet. Method 1300 includes abutting a lateral edge of a roll-off rack shock pallet to the pallet interface attached to a second edge of the loading platform to complete the engagement to the at least one top guide and the at least one bottom guide (block 1316). Method 1300 includes translating an RIHS between the roll-off rack shock pallet and the loading platform (block 1318). Method 1300 includes transferring the RIHS through the lateral opening using a pallet jack sized for the lateral opening (block 1320). Then method 1300 ends.

In the above described flow chart, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A data center comprising:
   an enclosure having a raised floor and a lateral opening having a bottom edge that is aligned with the raised floor in order to transfer a rack information handling system (RIHS) through the lateral opening for a selected one of: (i) removing the RIHSs from the raised floor; and (ii) delivering the RIHS to the raised floor; and
   a pallet interface that extends from an exterior edge of the raised floor and is presented to abut and engage a lateral edge of a roll-off rack shock pallet that supports the RIHS during transport.

2. The data center of claim 1, wherein the pallet interface comprises:
   at least one top guide extending from the pallet interface to contact a top surface of the roll-off rack shock pallet; and
   at least one bottom guide that engages a downward surface of the roll-off rack shock pallet, the at least one top guide and the at least one bottom guide receiving and aligning the roll-off rack shock pallet.

3. The data center of claim 1, further comprising a loading platform located between the pallet interface and the raised floor, the loading platform having a first edge that is engageable to the raised floor of the enclosure and having a second edge that comprises the pallet interface.

4. The data center of claim 3, further comprising a docking alignment plate attachable to the raised floor, wherein a selected one of the docking alignment plate and the first edge of the loading platform comprises male engagement features and the other one of the docking alignment plate and the first edge of the loading platform comprises female engagement features have a complementary shape to the male engagement features to horizontally receive and align the upper surface of the loading platform to the raised floor of the enclosure.

5. The data center of claim 3, further comprising a transition plate positionable in an opening between the raised floor and an upper surface of the loading platform to provide a level sliding surface.

6. The data center of claim 3, further comprising two or more height adjustable supports extendable downward from the loading platform in order to level the loading platform.

7. The data center of claim 1, wherein the enclosure comprises a container of a modular data center (MDC) that is transportable to a deployed location.

8. A rack information handling system (RIHS) delivery kit comprising:
   a docking alignment plate attachable to a raised floor of an enclosure of a data center, the enclosure having the raised floor and a lateral opening having a bottom edge that is aligned with the raised floor in order to transfer an RIHS through the lateral opening for a selected one of: (i) removing the RIHSs from the raised floor; and (ii) delivering the RIHS to the raised floor, the docking alignment plate horizontally alignable with the lateral opening of the enclosure at an exterior edge of the raised floor; and
   a loading platform having a first edge engagement to the docking alignment plate to align an upper surface of the loading platform with the raised floor of the enclosure, the loading platform having a second edge that comprises a pallet interface that is vertically presented to abut and engage a lateral edge of a roll-off rack shock pallet that supports the RIHS during transport.

9. The RIHS delivery kit of claim 8, wherein the pallet interface comprises:
   at least one top guide extending from the pallet interface to contact a top surface of the roll-off rack shock pallet; and
   at least one bottom guide that engages a downward surface of the roll-off rack shock pallet, the at least one top guide and the at least one bottom guide receiving and aligning the roll-off rack shock pallet.

10. The RIHS delivery kit of claim 8, wherein a selected one of the docking alignment plate and the first edge of the loading platform comprises male engagement features and the other one of the docking alignment plate and the first edge of the loading platform comprises female engagement features that have a complementary shape to the male engagement features to horizontal receive and align the upper surface of the loading platform to the raised floor of the enclosure.

11. The RIHS delivery kit of claim 8, further comprising a transition plate positionable in the opening between the raised floor and an upper surface of the loading platform to provide a level sliding surface.

12. The RIHS delivery kit of claim 8, further comprising two or more height adjustable supports extendable downward from the loading platform in order to level the loading platform.

13. The RIHS delivery kit of claim 8, further comprising a rack forklift sized to move the RIHS through the lateral opening in the enclosure.

14. A method of removing a rack information handling system (RIHS) from and delivering an RIHS to a data center, the method comprising:
   horizontally aligning a docking alignment plate with a lateral opening to an enclosure having a raised floor, the lateral opening having a bottom edge that is aligned with the raised floor in order to transfer an RIHS through the lateral opening for completing a selected one of: (i) removing the RIHS s from the raised floor; and (ii) delivering the RIHS to the raised floor;
   attaching the docking alignment plate to an exterior edge of the raised floor beneath the lateral opening;
   engaging a first edge of a loading platform to the docking alignment plate that aligns an upper surface of the loading platform to the raised floor;
   engaging a lateral edge of a roll-off rack shock pallet to a second edge of the loading platform; and
   translating an RIHS between the roll-off rack shock pallet and the loading platform.

15. The method of claim 14, further comprising supporting the roll-off rack shock pallet with a forklift engaged to the roll-off rack shock pallet on a side of the roll-off rack shock pallet opposite to the loading platform.

16. The method of claim 15, wherein engaging the lateral edge of the roll-off rack shock pallet to the second edge of the loading platform comprises:
   horizontally moving the roll-off rack shock pallet between at least one top guide and at least one bottom guide, the at least one top guide extending from the pallet interface to contact a top surface of the roll-off rack shock pallet, and the at least one bottom guide contacting a downward surface of the roll-off rack shock pallet.

17. The method of claim 14, wherein engaging the first edge of the loading platform to the docking alignment plate comprises engaging male engagement features of a selected one of the docking alignment plate and the first edge of the loading platform to female engagement features of the other one of the docking alignment plate and the first edge of the loading platform to align the upper surface of the loading platform to the raised floor of the enclosure.

18. The method of claim 14, further comprising positioning a transition plate in an opening between the raised floor and an upper surface of the loading platform to provide a level sliding surface.

19. The method of claim 14, further comprising adjusting two or more height adjustable supports extendable downward from the loading platform in order to level the loading platform.

20. The method of claim 14, further comprising transferring he RIHS through the lateral opening using a rack forklift sized for the lateral opening.

\* \* \* \* \*